United States Patent
Brewer et al.

(10) Patent No.: US 10,310,139 B2
(45) Date of Patent: Jun. 4, 2019

(54) ANISOTROPIC GEOMETRY-ADAPTIVE REFINEMENT FOR RESERVOIR MESH CREATION

(71) Applicant: LANDMARK GRAPHICS CORPORATION, Houston, TX (US)

(72) Inventors: Michael L. Brewer, Katy, TX (US); Steven B. Ward, Austin, TX (US)

(73) Assignee: LANDMARK GRAPHICS CORPORATION, Houston, TX (US)

( * ) Notice: Subject to any disclaimer, the term of this patent is extended or adjusted under 35 U.S.C. 154(b) by 166 days.

(21) Appl. No.: 15/313,933

(22) PCT Filed: Jul. 11, 2014

(86) PCT No.: PCT/US2014/046322
§ 371 (c)(1),
(2) Date: Nov. 23, 2016

(87) PCT Pub. No.: WO2016/007169
PCT Pub. Date: Jan. 14, 2016

(65) Prior Publication Data
US 2017/0199303 A1    Jul. 13, 2017

(51) Int. Cl.
*G01V 99/00* (2009.01)
*G06F 17/50* (2006.01)

(52) U.S. Cl.
CPC .......... *G01V 99/005* (2013.01); *G01V 99/00* (2013.01); *G06F 17/5009* (2013.01)

(58) Field of Classification Search
CPC ............... G01V 99/005; G01V 11/00; G01V 2210/646; G06F 17/5009
USPC .................................................. 703/10; 702/6
See application file for complete search history.

(56) References Cited

U.S. PATENT DOCUMENTS 7,634,395 B2    12/2009    Flandrin et al.
2014/0136171 A1    5/2014    Sword, Jr. et al.

OTHER PUBLICATIONS

Korean Intellectual Property Office, International Search Report and Written Opinion, dated Feb. 24, 2015, 13 pages, Korea.
H.W. Zheng, N. Qin, F.C.G.A. Nicolleau and C. Shu, Quadrilateral Cell-Based Anisotropic Adaptive Solution for the Euler Equations, Communication in Computational Physics, Jan. 2011, pp. 68-88, vol. 9, No. 1, Great Britain and Singapore.
Z. J. Zhang and C.P.T. Groth, Parallel High-Order Anisotropic Block-Based Adaptive Mesh Refinement Finite-Volume Scheme, 20th AIAA Computational Fluid Dynamics Conference, Jun. 27-30, 2011, pp. 1-29, AIAA 2011-3695, Honolulu, Hawaii.
Youssef Mesri, Hervé Guillard and Thierry Coupez, Automatic coarsening of three dimensional anisotropic unstructured meshes for multigrid applications, Applied Mathematics and Computation, Elsevier, 2012, 218 (21), p. 10500-10509.

*Primary Examiner* — Eunhee Kim

(57) ABSTRACT

A system and method inserts fracture networks into an existing Earth Model that exists as a structured grid and physical property values. The fracture network is in the form of a surface mesh (manifold or non-manifold) in a three-dimensional ("3D") space. The structured grid of the Earth Model is then anisotropically refined to resolve the fractures and to provide appropriate cell grading in the near-fracture region. The generated Earth Model may be utilized in a variety of applications, including for example, a reservoir simulation.

22 Claims, 12 Drawing Sheets

ANISOTROPIC GEOMETRY-ADAPTIVE REFINEMENT FOR RESERVOIR MESH CREATION

CROSS-REFERENCE TO RELATED APPLICATIONS

This application is a U.S. national stage patent application of International Patent Application No. PCT/US2014/046322, filed on Jul. 11, 2014, the benefit of which is claimed and the disclosure of which is incorporated herein by reference in its entirety.

FIELD OF THE DISCLOSURE

The present disclosure relates generally to hydrocarbon reservoir modeling and, more specifically, to a system which modifies a structured grid of an Earth Model to create an anisotropically refined computational mesh.

BACKGROUND

In the oil and gas industry, reservoir modeling involves the construction of a computer model of a petroleum reservoir for the purpose of improving estimation of reserves and making decisions regarding the development of the field. For example, geological models may be created to provide a static description of the reservoir prior to production. In contrast, reservoir simulation models may be created to simulate the flow of fluids within the reservoir over its production lifetime.

With reservoir simulation models, the modeling of fractures within a reservoir can present a challenge, requiring a thorough understanding of matrix flow characteristics, fracture network connectivity, and fracture-matrix interaction. Fractures can be described as open cracks or voids within the formation and can either be naturally occurring or artificially generated from a wellbore. The correct modeling of the fractures is important as the properties of fractures such as spatial distribution, aperture, length, height, conductivity, and connectivity significantly affect the flow of reservoir fluids to the well bore.

Mesh generation techniques are commonly used in reservoir modeling. Two common mesh generation techniques, for three-dimensional reservoir simulation, are structured-based meshing and extrusion based meshing. In the most typical structured techniques, hexahedra are connected in a logical i-j-k space with each interior mesh node being adjacent to 8 hexahedra. Several extensions and generalizations exist, including Local Grid Refinement where local regions of an original grid are replaced with finer grids. This meshing technique works well for a variety of reservoir configurations, but can become time-consuming and prohibitively burdensome for users when dealing with general reservoir geometries, like arbitrary three-dimensional fracture surface. Because of the inherent 2.5 dimensional nature of extrusion techniques, similar limitations apply to these techniques. Alternatively, fully-unstructured meshing techniques do exist, including tetrahedralization and polyhedral meshing schemes. The increased complexity of these fully-unstructured techniques often leads to lower robustness, when compared to the structured method, especially, in the presence of imperfect geometry input ("dirty geometry").

DESCRIPTION OF ILLUSTRATIVE EMBODIMENTS

Figure 1:
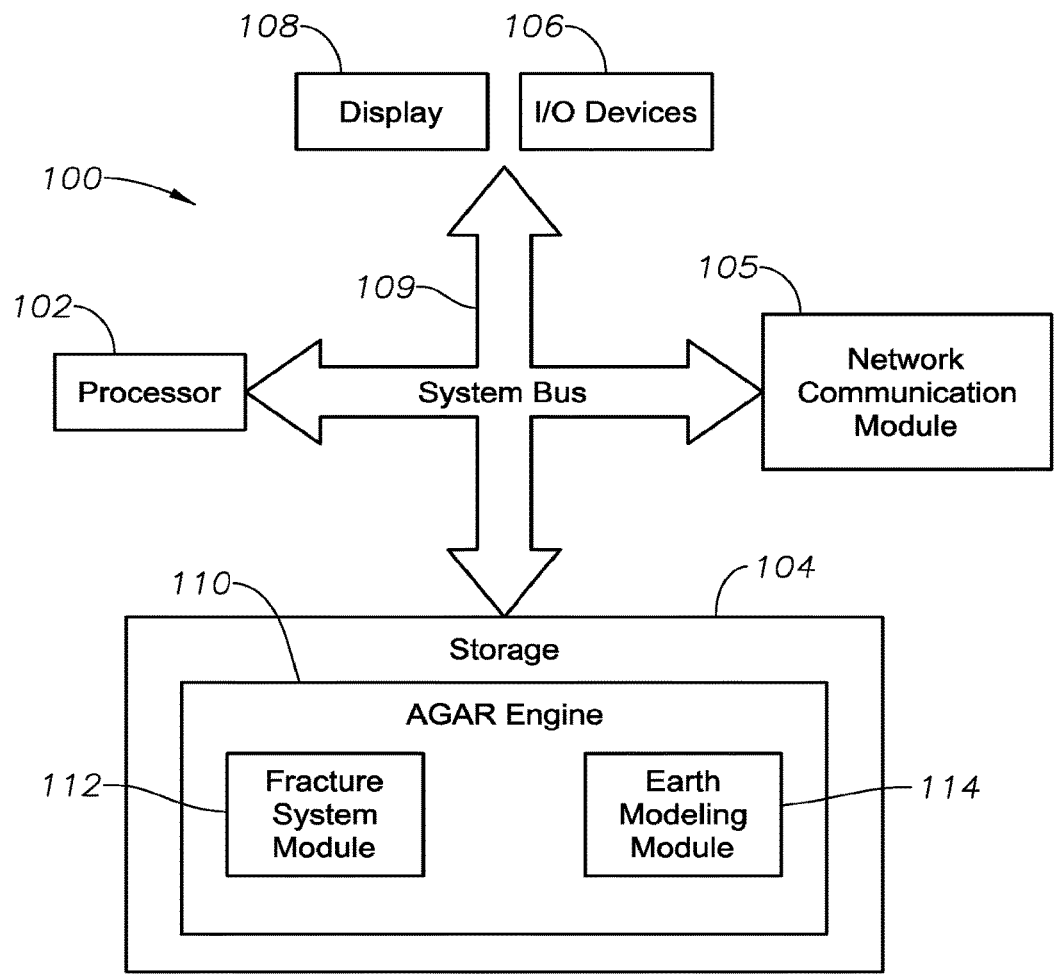
FIG. 1 illustrates a block diagram of an Anisotropic, Geometry-Adaptive Refinement system according to certain illustrative embodiments of the present disclosure.

Illustrative embodiments and related methodologies of the present disclosure are described below as they might be employed in a system which applies anisotropic, geometry-adaptive refinement in order to create a reservoir mesh. In the interest of clarity, not all features of an actual implementation or methodology are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure. Further aspects and advantages of the various embodiments and related methodologies of the disclosure will become apparent from consideration of the following description and drawings.

As will be described below, illustrative methods and embodiments of the present disclosure modify a structured grid of an Earth Model to thereby create a computational mesh that 1) is suitable for use in reservoir simulation, 2) respects the original Earth Model properties and geometry, and 3) resolves additional natural hydraulic fracture systems. The various alternative embodiments described herein, also referred to as Anisotropic Geometry-Adaptive Refinement ("AGAR"), are methods for inserting fracture networks into an existing Earth Model, which exists as a structured grid and physical property values. The fracture network is in the form of a surface mesh (manifold or non-manifold) in a three-dimensional ("3D") space. The structured grid of the Earth Model is then anisotropically refined to resolve the fractures and to provide appropriate cell grading in the near-fracture region.

In general, the illustrative algorithms utilized in the methods and systems described herein examine cells to determine those cells which require refinement, refines those cells in the appropriate directions (thus, anisotropic), and then terminates once no cell requires refinement. Refinement, as used herein, refers to the splitting of cells in the 3D space which ultimately results in a higher mesh resolution Earth Model. A fracture network is then resolved within the Earth Model using the refined cells. Resolved, as used herein, refers to generating an earth model, using the high resolution mesh, in which the fractures and near-fracture areas in the model have a higher mesh resolution than the other areas of the model. Since the mesh will be used for numerical simulation, in general the smaller cells (as a result of the refinement) will result in more accurate solutions when compared to larger cells. Since reservoir simulators generate approximations of mathematical formulas, the smaller the cells, the closer the approximation mimics the mathematical formula.

Moreover, since the algorithm applies an anisotropic approach when manipulating the cells, the data count and its associated computational requirements are greatly reduced. As a result, the method is faster and more efficient than conventional methods which apply a brute-force analysis to all cells, thus resulting in more data and resource taxing computations. Furthermore, because of the generated Earth Model's relationship to the original Earth Model, property interpolation is minimized and the generated Earth Model respects the original property values well. Accordingly, embodiments of the present disclosure provide higher mesh resolution modeling while also reducing the computational requirements.

FIG. 1 shows a block diagram of an AGAR system 100 according to certain illustrative embodiments of the present disclosure. AGAR system 100 includes at least one processor 102, a non-transitory, computer-readable storage 104, transceiver/network communication module 105, optional I/O devices 106, and an optional display 108 (e.g., user interface), all interconnected via a system bus 109. Software instructions executable by the processor 102 for implementing software instructions stored within AGAR engine 110 in accordance with the illustrative embodiments and methods described herein, may be stored in storage 104 or some other computer-readable medium. Although not explicitly shown in FIG. 1, it will be recognized that AGAR system 100 may be connected to one or more public and/or private networks via one or more appropriate network connections. It will also be recognized that the software instructions comprising AGAR engine 110 may is also be loaded into storage 104 from appropriate storage media (e.g. a portable memory/hardrive, a CD-ROM, or the like) via wired or wireless methods.

Moreover, those ordinarily skilled in the art will appreciate that the disclosure may be practiced with a variety of computer-system configurations, including hand-held devices, multiprocessor systems, microprocessor-based or programmable-consumer electronics, minicomputers, mainframe computers, and the like. Any number of computer-systems and computer networks are acceptable for use with the present disclosure. The disclosure may be practiced in distributed-computing environments where tasks are performed by remote-processing devices that are linked through a communications network. In a distributed-computing environment, program modules may be located in both local and remote computer-storage media including memory storage devices. The present disclosure may therefore, be implemented in connection with various hardware, software or a combination thereof in a computer system or other processing system.

Still referring to FIG. 1, in certain illustrative embodiments, AGAR engine 110 comprises fracture system module 112 and earth modeling module 114. Fracture system module 112 provides the geometric definition of the fracture network, along with the petrophysical and mechanical property distributions for the fractures, as would be understood by those ordinarily skilled in the art having the benefit of this disclosure. An illustrative fracture system module may be, for example, the Fracpro® or Gohfer® platforms.

Still referring to the illustrative embodiment of FIG. 1, AGAR engine 110 also includes earth modeling module 114 to integrate with the fracture data contained within fracture system module 112 in order to provide subsurface stratigraphic visualization of the fractures and reservoir including, for example, geo science interpretation, petroleum system modeling, geochemical analysis, stratigraphic gridding, facies, net cell volume, and petrophysical property modeling. In addition, earth modeling module 114 models well paths, as well as cross-sectional through the facies and porosity data. Illustrative earth modeling platforms include DecisionSpace®, which is a commercially available software application marketed by Landmark Graphics Corporation of Houston, Tex. However, those ordinarily skilled in the art having the benefit of this disclosure realize a variety of other earth modeling platforms may also be utilized with the present disclosure.

AGAR engine 110 may also include processing circuitry to enable robust data retrieval and integration of historical and real-time reservoir related data that spans across all aspects of the well planning, construction and completion processes such as, for example, drilling, cementing, wireline logging, well testing and stimulation. Moreover, such data may include, for example, logging data, well trajectories, petrophysical rock property data, mechanical rock property data, surface data, fault data, data from surrounding wells, data inferred from geostatistics, etc. The database (not shown) which stores this information may reside within fracture system module 112 or at a remote location. An illustrative database platform is, for example, the INSITE® software suite, commercially offered through Halliburton Energy Services Inc. of Houston Tex. Those ordinarily skilled in the art having the benefit of this disclosure realize there are a variety of software platforms and associated systems to retrieve, store and integrate the well related data, as described herein.

In addition, AGAR engine 110 may also include multi-domain workflow automation capabilities that may connect any variety of desired technical applications. As such, the output from one application, or module, may become the input for another, thus providing the capability to analyze how various changes impact the well placement and/or fracture design. Those ordinarily skilled in the art having the benefit of this disclosure realize there are a variety of workflow platforms which may be utilized for this purpose.

As generally described above, methods and embodiments of the present disclosure describe algorithms for automatic mesh refinement to resolve features in a reservoir for applications that include, but are not limited to, reservoir simulation and modeling. An important aspect of the present disclosure is the ability to selectively apply anisotropic refinement in order to reduce the degrees of freedom for subsequent analysis using the generated Earth Model.

A. An Illustrative Refinement Algorithm.

In general, the illustrative refinement algorithms described herein refine cell edges up to "n" time and does not split any edge (and, thus, splitting the cell) that will produce an edge shorter than the "targetSize." As defined herein, "targetSize" is the desired mesh size, or edge length, necessary to resolve the fracture width. In certain embodiments, the targetSize value is provided to the system based upon a desired level of accuracy and the desired time to solution. In order to generate the Earth Models, the methods must determine whether a cell should be refined and in what direction those cells should be refined. In certain illustrative embodiments, there are two types of rules for determining whether a cell should be refined: 1) gradation rules (rules that ensure slow transitions in element side) and 2) intersection rules (rules that ensure the fractures are adequately represented).

In a generalized example to summarize the method, consider the U directions (one direction in a 3D space). Note that U is direction in a topological sense, not in a Euclidean sense. The U "direction" for each cell is independent of the U direction for a neighbor cell. Further, within a cell, one "U" edge might point in a slightly different direction than another "U" edge. As will be described in more detail below, considering the U direction, AGAR engine 110 will analyze all cells within the model and refine those near-fracture cells in the U direction if all U edges are longer than C×targetSize and at least one of the following Rules are met: 1) a scaled U edge intersects a fracture; 2) for any opposing pair of edges in the U direction, exactly one of the two scaled edges intersect a fracture; 3) a U edge has two or more "hanging" nodes; 4) for any opposing pair of edges in the U direction, exactly one of the two edges has two or more hanging nodes; or 5) the unsealed cell intersect a fracture but no scaled edge of the cell intersects a fracture. Referring to C×targetSize, for an implementation-specific or user-supplied scalar variable, C, AGAR system 100 will not split any edges (thus, cells) that are shorter than C×targetSize. In this illustrative method, C is selected as $\sqrt{2}$, but could be other variables such as, for example, 4/3 or any finite value. This process is repeated for each direction in the 3D space.

For purposes of this disclosure, a "hanging node" is a node, generally created during the refinement of a neighboring cell, which is not required to maintain the underlying geometry of the cell of interest. For example, the underlying geometry of may be a hexahedron. Consider a cell H, when a neighboring cell is refined, an extra node is added the hexahedron-shaped cell H. This node is "hanging" with respect to cell H. In yet other illustrative embodiments, the edge length requirement may be omitted for Rules 3 and 4 if strict adherence to the one hanging node guideline is adopted.

Figure 2:
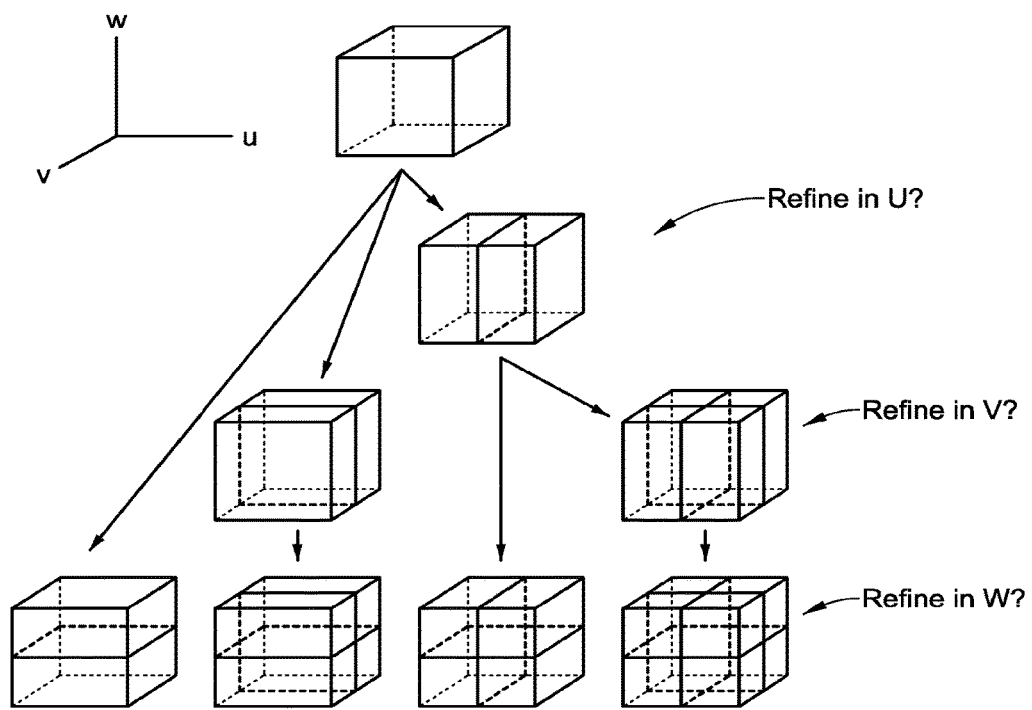
FIG. 2 illustrates eight possible refinement configurations for a single cell within a three-dimensional u-v-w space.

Once the desired refinement directions have been determined for a cell, AGAR engine 110 performs the refinement (i.e., splitting of edges) for that cell. FIG. 2 illustrates eight possible refinement configurations for a single cell within a 3D u-v-w space. As shown, AGAR engine 110, via the algorithm, iteratively performs the methods described herein by first determining whether the near-fracture cells should be refined in the U, V, or W directions, and then, if so, splitting the edges in the necessary directions as shown. The eight possible configurations of cell refinement ranging from refining in no refinement directions (top) to refining in all refinement directions (bottom right). Since these cells will be those cells positioned in the near-fracture region, the mesh resolution of the resulting images will be greatly improved.

Now that a summarized description of the methods have been provided, a more detailed discussion will now be provided. In order to generate the reservoir Earth Models, this method first determines which cells need to be refined and in which direction those cells should be refined. To achieve this, AGAR engine 110 can first begin with a uniform, axially-aligned, structured hexahedral grid. However, in other embodiments, it is not necessary to begin with a uniform, axially-aligned grid. Nevertheless, as data input to the refinement algorithm, AGAR engine 110 requires: 1) M={$C_i$}, the initial set of mesh cells to be refined, 2) F={$F_i$}, the set of triangular facets representing the fractures, 3) ω, desired "width" of cells to adequately resolve fractures, and 4) α, desired mesh size "along" the fractures.

Because the initial grid, M, is uniform, there is a characteristic grid size, ττ. Therefore, AGAR engine 110 computes two numbers:

$$n_{iso} = \left\lfloor \log_{\frac{1}{2}} \frac{\alpha}{\tau} \right\rfloor, \text{ and} \qquad \text{Eq. (1)}$$

$$n_{tot} = \left\lfloor \log_{\frac{1}{2}} \frac{\omega}{\tau} \right\rfloor, \text{ where} \qquad \text{Eq. (2)}$$

$$n_{ani} = n_{tot} - n_{iso}.$$

which will define the number of levels of refinement performed by AGAR engine 110. AGAR engine 110 will perform $n_{iso}$ $n_{iso}$ levels of isotropic refinement to obtain a mesh of size, $$\hat{\alpha} = \tau \left(\frac{1}{2}\right)^{n_{iso}},$$

near the fractures. Then, AGAR engine 110 will perform $n_{ani}$ $n_{ani}$ levels of anisotropic refinement to obtain a mesh of "width", $$\hat{\omega} = \tau \left(\frac{1}{2}\right)^{n_{tot}},$$

near the fractures. Note that we have $\hat{\alpha} \cong \alpha$ and $\hat{\omega} \cong \omega$.

Accordingly, in one illustrative method, the general algorithm applied by AGAR 110 may be expressed as:

```
refine(n, doIsotropic, targetSize)
    for iteration = 1...∞
        sizeLimit = targetSize *2^(n-min(n,iteration))
        for C in M    //Loop over each cell in the mesh at this iteration
            directions = determineDirections
                (C,F,iteration,sizeLimit,n,doIsotropic)
            refineInGivenDirections(directions,C)
        if no changes were made during this iteration
            exit routine
```

In this Routine 1, the "Refine" algorithm is called with an integer to specify how many levels of refinement to perform and a Boolean to specify whether it is isotropic refinement or not. Note that, in this example, the routine is called twice. AGAR engine 110 calls refine($n_{iso}$,true,$\hat{\alpha}$) followed by refine ($n_{ani}$,false,$\hat{\omega}$). Essentially, to perform n levels of refinement, AGAR engine 110 loops over the cells until no more changes are required. Because AGAR engine 110, via the algorithm, disallows splitting any edge that is shorter than C×targetSize during any iteration, the algorithm will ultimately terminate. One of the most complex parts of the algorithm is encapsulated in the "determineDirections" method, given in Routine 2 below, which returns a subset of the local 3D directions {U, V, W} depending on which directions should be refined. Note that the "sizeLimit", used to define the smallest edge during any iteration, is large for early iterations. By the $n^{th}$ iteration, and for all subsequent iterations, sizeLimit is equal to targetSize. Routine 2 may be expressed as:

```
determineDirections(C,F,iteration,sizeLimit,n,doIsotropic)
    directions = Ø
    // add any refinement directions required due to
    fracture-cell intersection
    // this is only allowed during the first n iterations
    if iteration <= n    // in the intersection stage
        directions = getDirectionsFromIntersections(C,F)
    //add any refinement directions required due to gradation
    //this will only be necessary for iteration > 1
    if iteration > 1
        directions = directions ∪ getDirectionsFromGradation(C)C)
    // if we want isotropic and we found any
    direction, do all directions
    if doIsotropic & (directions ≠ Ø)
        directions = ALL
    //remove any directions disallowed, regardless of what
    we have found
        directions = directions −
        getDisallowedDirections(C,F,sizeLimit)
        return directions
```

In this illustrative Routine 2, "determineDirections" primarily uses sub-routines getDirectionsFromGradation and getDirectionsFRomIntersections. As shown in "determineDirections" from Routine 2, only during the first n iterations, does AGAR engine 110 refine near-fracture cells based on the interaction with the fractures, which will be described in more detail below. During any iteration after the first, AGAR engine 110 refines cells based on the "one hanging node rule." That is, if an edge of the cell has been split more than once (due to a neighbor being refined), the cell must be refined. If AGAR engine 110 is performing an "isotropic" refinement, then whenever it needs to refine a cell in any direction, it refines the cell in all directions.

All of the directions marked for refinement must pass a final test before being accepted. By refining in a given direction, four edges must be split. If any of those four edges are shorter than C×targetSize, then the direction is rejected by AGAR engine 110.

Figure 3:
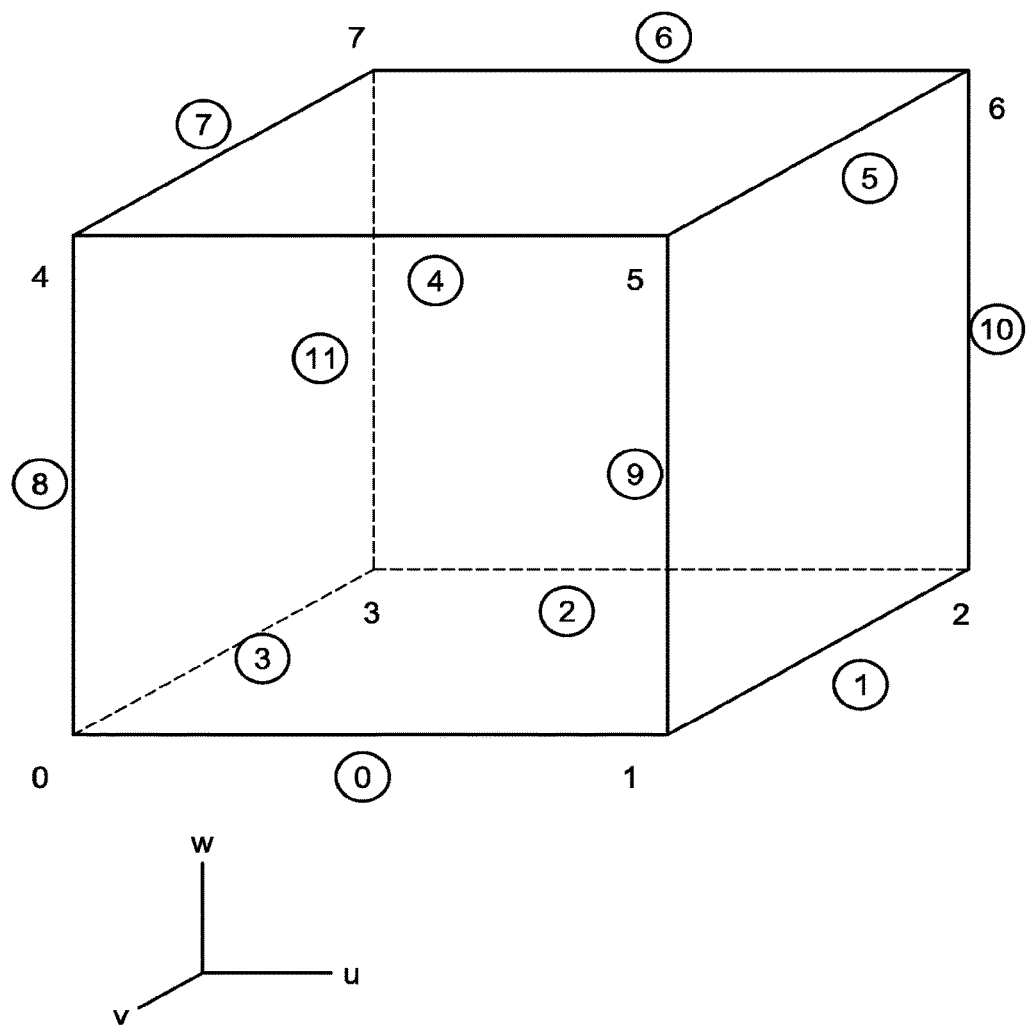
FIG. 3 illustrates a representative cell showing the local three-dimensional coordinate system and number scheme, in accordance to certain illustrative embodiments of the present disclosure.

Because the initial mesh is comprised of hexadedra, each cell can be represented by a canonical numbering system described below. FIG. 3 illustrates a representative cell showing the local 3D coordinate system and number scheme, in accordance to certain illustrative embodiments of the present disclosure. In FIG. 3, the u-v-w directions are defined by the mapping of the nodes to this numbering system (note that it is drawn as a left-handed system). Numbers representing edges are circled, while numbers representing nodes are not circled. The mapping of the u-v-w system to the x-y-z system may differ for neighboring cells. In this example, consider edges $\{0,2,4,6\}$ to be U edges, edges $\{1,3,5,7\}$ to be V edges, and edges $\{8,9,10,11\}$ to be W edges.

Using the canonical numbering scheme in FIG. 3, the edges of the cell, $C_i$, are labeled as $\{e_{i,j}\}$ for j=0 . . . 11. The returned set from getDirectionsFromGradation($C_i$) includes: 1) U if any edge from the set $\{e_{i,0}, e_{i,2}, e_{i,4}, e_{i,6}\}$ has been refined at least twice, 2) V if any edge from the set $\{e_{i,1}, e_{i,3}, e_{i,5}, e_{i,7}\}$ has been refined at least twice, and 3) W if any edge from the set $\{e_{i,8}, e_{i,9}, e_{i,10}, e_{i,11}\}$ has been refined at least twice. This condition is referred to as the "primary condition" for gradation. Further, if, given two opposing edges on a face, exactly one of those edges has been refined at least twice, then the direction that divides those two edges will also be refined by AGAR engine 110. For example, edges $\{e_{i,8}, e_{i,9}\}$ are opposing edges on a face. If edge $\{e_{i,8}\}$ has been refined twice but edge $\{e_{i,9}\}$ has been refined once, then this condition would be satisfied, and direction U would be added to the refinement set. This test is referred to as the "opposing condition" for gradation. Note that for all tests in getDirectionsFromGradation, AGAR engine 110 only considers the number of times the edge was split (i.e., refined) prior to the current iteration. In this way, AGAR engine 110 lessens its dependence on the order in which the cells are seen by the algorithm.

B. Testing Cell-Facet Intersection.

An important aspect of the refinement algorithm utilized in certain embodiments of the present disclosure is defining a test of whether a given cell, $C_i$, intersects a given fracture facet, $F_k$. See FIG. 3 for the number scheme used by AGAR engine 110 for nodes and edges of the cell. To continue in describing this illustrative method, AGAR engine 100 defines the scaling transform, $S_\beta()$, which scales the distance between an object's (node) center and each node by the scalar value, β. In this illustrative algorithm, β is set to be 2, but determining the most appropriate value of β is a design choice and may be modified, as will be understood by those ordinarily skilled in the art having the benefit of this disclosure. Note that AGAR engine 110 may apply this transform to the cell, yielding a scaled cell, or to the edges, yielding a set of scaled edges. These two applications of the transform yield different results, as shown in FIGS. 4 and 5, which illustrate the scaling function, $S_\beta()$, applied to a cell, and the scaling function, $S_\beta()$, applied to the edges of the cell, respectively.

Figure 4:
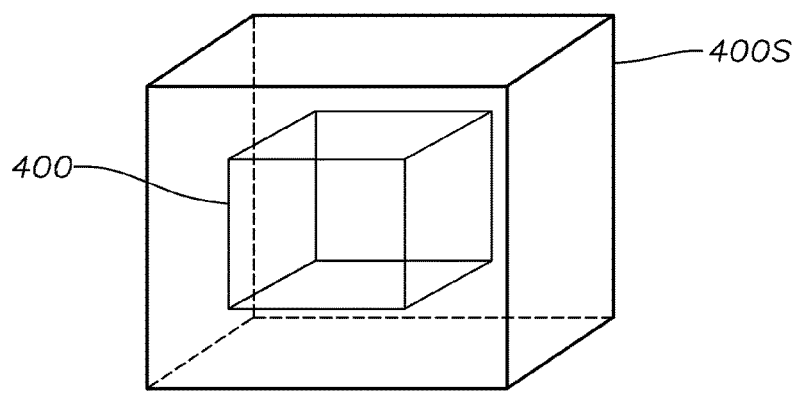
FIGS. 4 and 5 illustrate the application of scaling functions to a cell and cell edges, respectively, according to certain illustrative embodiments of the present disclosure.
Figure 5:
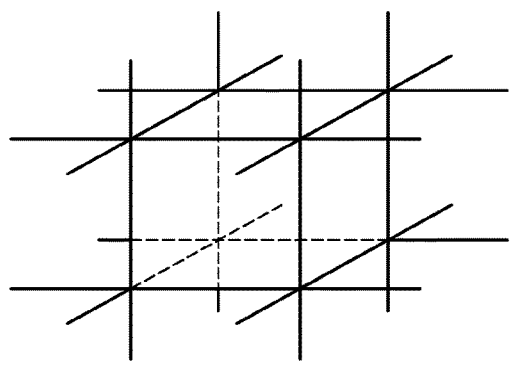

Still referring to FIGS. 4 and 5, the Boolean function $\tau_\beta(C_i,F)$ is true if and only if there exists a fracture $F_k \in F$ such that the intersection of the scaled cell and the fracture is nonempty ($S_\beta(C_i) \cap F_k \neq \emptyset$). For edges, the function is slightly altered so that it will return false whenever the edge lies in the plane of the facet. Therefore, for edges, $\tau_\beta(e_{i,j},F)$ is true if and only if there exists a fracture $F_k \in F$ such that both the intersection of the scaled edge and the fracture is nonempty and $F_k$'s normal is not perpendicular (or transverse in other embodiments) to the edge ($[(S_\beta(e_{i,j}) \cap F_k \neq \emptyset) \& (\text{normal}(F_k) \cdot e_{i,j} > \epsilon)]$ for some a specified, small $\epsilon$). Essentially, the function is true when the scaled entity intersects the facets, excepting the case of the edge lying in the plane of the facet. Therefore, this results in the edge being split along a plane that is transverse (e.g., perpendicular) to an axis of the fracture within the fracture network.

Now, an illustrative algorithm used in Routine 2 that defines getDirectionsFromIntersections($C_i$,F) is specified. Note that, as in the case of the gradation tests above, the intersections tests include analogous "primary conditions" and "opposing conditions". This Routine 3 may be expressed as:

```
Set<Directions> getDirectionsFromIntersections(C_i,F)
    directionSet = Ø
    // do nothing if no facets intersect the scaled cell
    If τ_β(C_i,F) == false
        return directionSet
    // the "primary" condition
    //If a scaled edge intersects the fracture set, we refine perpendicular to it
    if ( 𝒯_β(e_{i,0},ℱ) | 𝒯_β(e_{i,2},ℱ) | 𝒯_β(e_{i,4},ℱ) | 𝒯_β(e_{i,6},ℱ) )
```

-continued

```
        directionSet = directionSet ∪ U
if (𝒥_β(e_{i,1},ℱ)|𝒥_β(e_{i,3},ℱ)|𝒥_β(e_{i,5},ℱ)|𝒥_β(e_{i,7},ℱ))
        directionSet = directionSet ∪ V
if (𝒥_β(e_{i,8},ℱ)|𝒥_β(e_{i,9},ℱ)|𝒥_β(e_{i,10},ℱ)|𝒥_β(e_{i,11},ℱ))
        directionSet = directionSet ∪ W
//the "opposing" condition
//If "opposing" edges have a different sign, refine the splitting direction
``` if $\left( \begin{array}{c} \mathcal{J}_{\beta(e^{i,8},\mathcal{F})} \neq \mathcal{J}_{\beta(e^{i,9},\mathcal{F})} \mid \mathcal{J}_{\beta(e^{i,10},\mathcal{F})} \neq \mathcal{J}_{\beta(e^{i,11},\mathcal{F})} \mid \\ \mathcal{J}_\beta(e_{i,1},\mathcal{F}) \neq \mathcal{J}_\beta(e_{i,3},\mathcal{F}) \mid \mathcal{J}_\beta(e_{i,5},\mathcal{F}) \neq \mathcal{J}_\beta(e_{i,7},\mathcal{F}) \end{array} \right)$ directionSet = directionSet ∪ U if $\left( \begin{array}{c} \mathcal{J}_{\beta(e^{i,8},\mathcal{F})} \neq \mathcal{J}_{\beta(e^{i,11},\mathcal{F})} \mid \mathcal{J}_{\beta(e^{i,9},\mathcal{F})} \neq \mathcal{J}_{\beta(e^{i,10},\mathcal{F})} \mid \\ \mathcal{J}_\beta(e_{i,0},\mathcal{F}) \neq \mathcal{J}_\beta(e_{i,2},\mathcal{F}) \mid \mathcal{J}_\beta(e_{i,4},\mathcal{F}) \neq \mathcal{J}_\beta(e_{i,6},\mathcal{F}) \end{array} \right)$ directionSet = directionSet ∪ V if $\left( \begin{array}{c} \mathcal{J}_{\beta(e^{i,3},\mathcal{F})} \neq \mathcal{J}_{\beta(e^{i,7},\mathcal{F})} \mid \mathcal{J}_{\beta(e^{i,1},\mathcal{F})} \neq \mathcal{J}_{\beta(e^{i,5},\mathcal{F})} \mid \\ \mathcal{J}_\beta(e_{i,0},\mathcal{F}) \neq \mathcal{J}_\beta(e_{i,4},\mathcal{F}) \mid \mathcal{J}_\beta(e_{i,2},\mathcal{F}) \neq \mathcal{J}_\beta(e_{i,6},\mathcal{F}) \end{array} \right)$ directionSet = directionSet ∪ W

```
//if set is empty but a facet intersects the unscaled cell, refine all
If(directionSet = ∅ & 𝒥_0(C_i,ℱ))
        directionSet = U ∪ V ∪ W
```

Here, note that the "Refine" algorithm is called by AGAR engine 110 with an integer to specify how many levels of refinement to perform and a Boolean to specify whether it is isotropic refinement or not.

Figure 6:
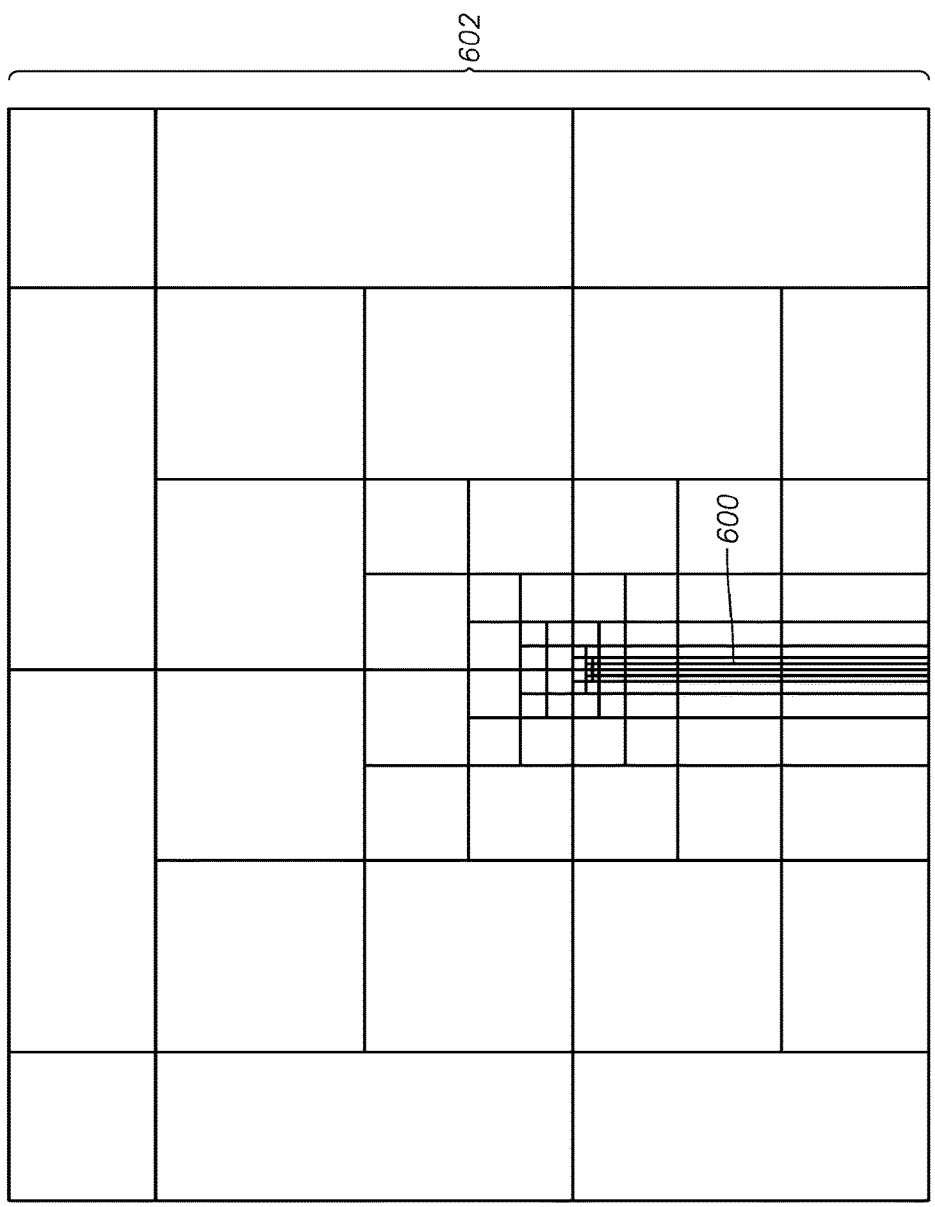
FIGS. 6 and 7 illustrate two different refinements generated using illustrative methods of the present disclosure.
Figure 7:
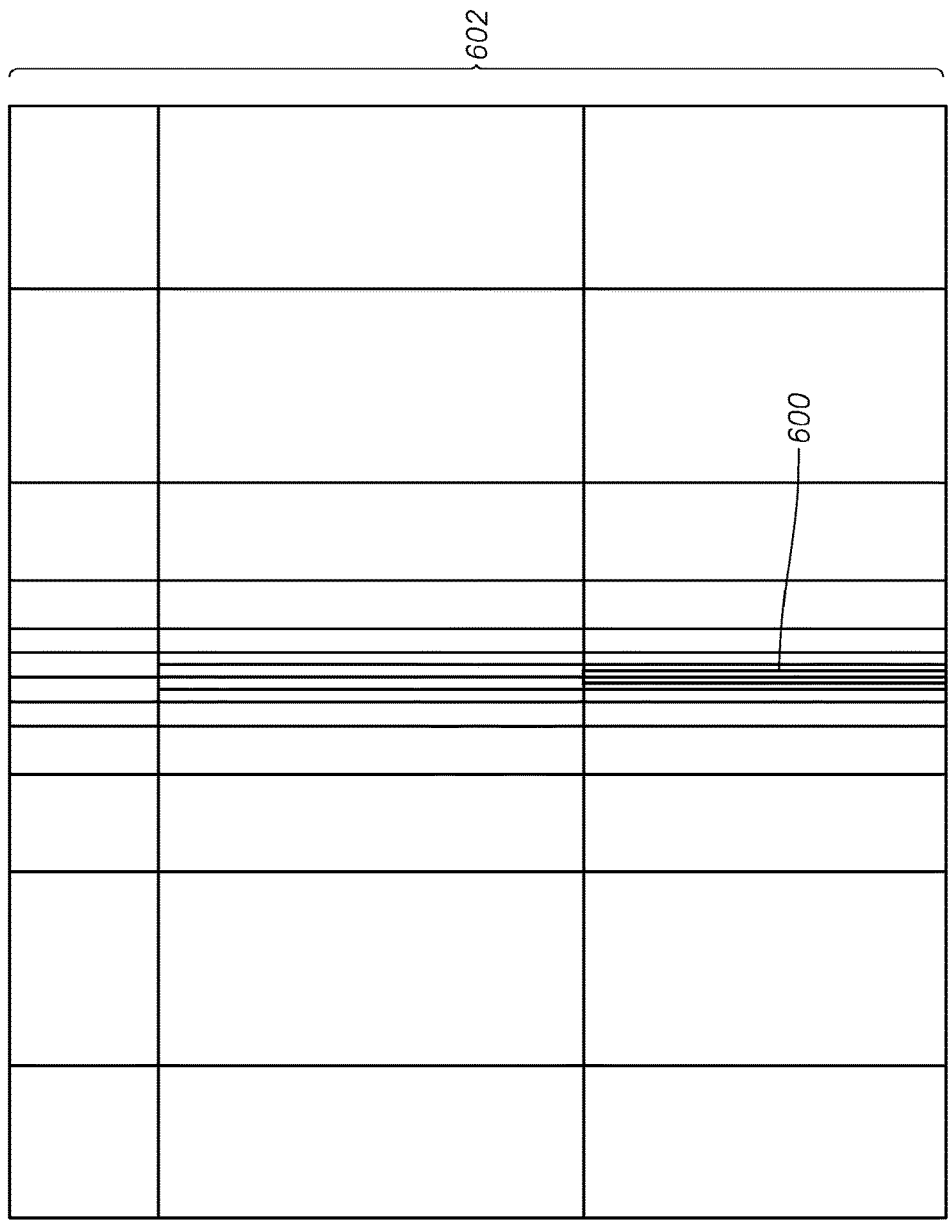

FIGS. 6 and 7 illustrate images AGAR meshes generated using illustrative embodiments of the present disclosure. In certain illustrative methods, note that the "opposing conditions", for determining the refinement directions, are used to restrict the anisotropic refinement in a localized (i.e., near-fracture) region. For example, consider FIGS. 6 (shows AGAR refinement near the end of a planar fracture 600) and 7 (shows the same model from FIG. 6 using AGAR with the "opposing conditions" disabled). Here, fracture 600 is shown surrounded by various cells 602 in the near-fracture region. Without the "opposing conditions" for the refinement direction selection as shown in FIG. 7, the end of the fracture would not have been resolved and the anisotropic refinement would have continued through the top of the picture.

Figure 8:
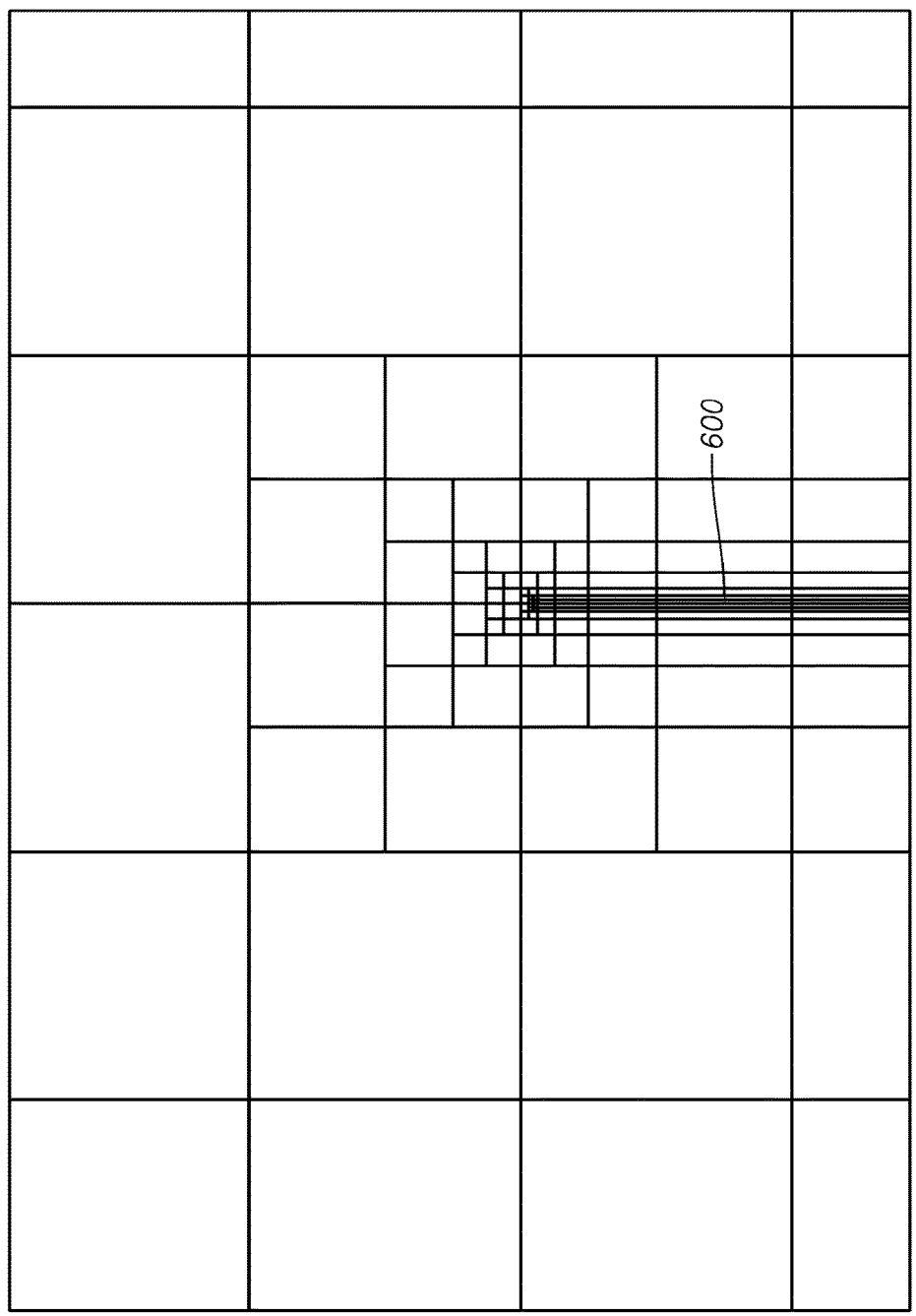
FIGS. 8 and 9 are images of meshes generated using illustrative embodiments of the present disclosure.
Figure 9:
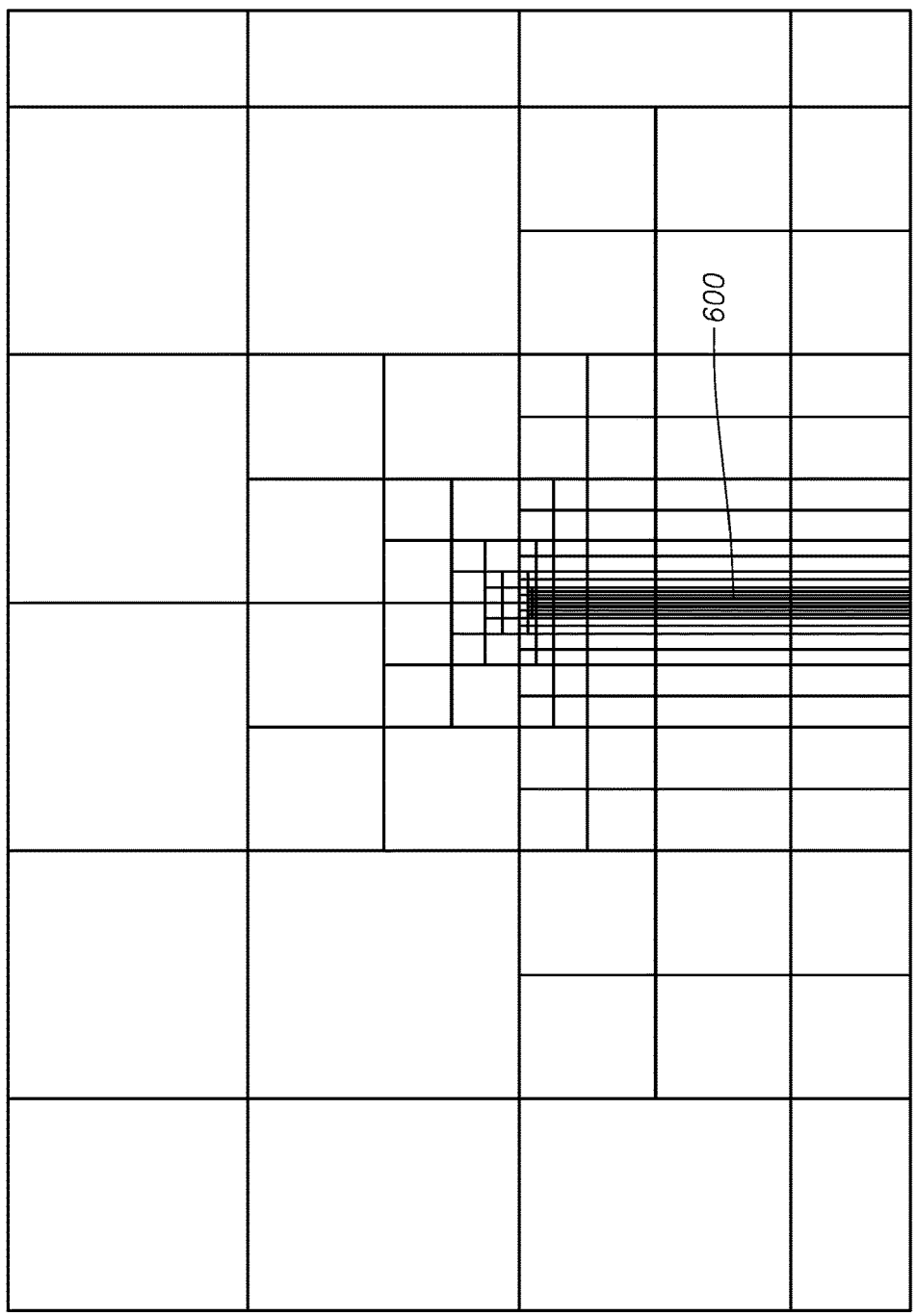

FIGS. 8 and 9 are additional images of AGAR meshes generated using illustrative embodiments of the present disclosure. FIG. 8 shows an end of fracture 600 with β=2, thus resulting in a mesh containing 1500 cells. FIG. 9 shows an end of fracture 600 with β=4, thus resulting in a mesh with 2260 cells.

Figure 10:
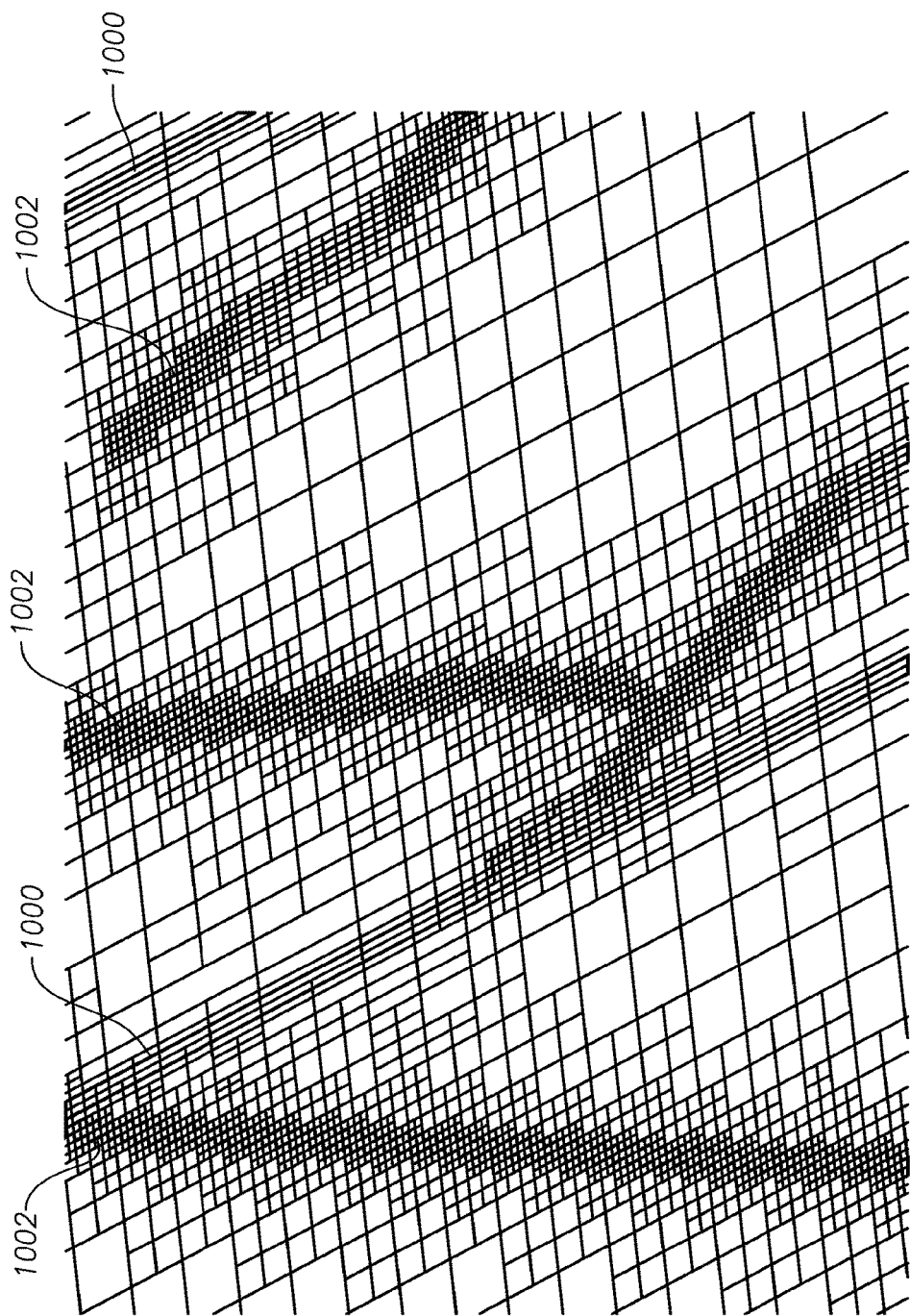
FIGS. 10 and 11 are full Earth Models generated using certain illustrative methods of the present disclosure.
Figure 11:
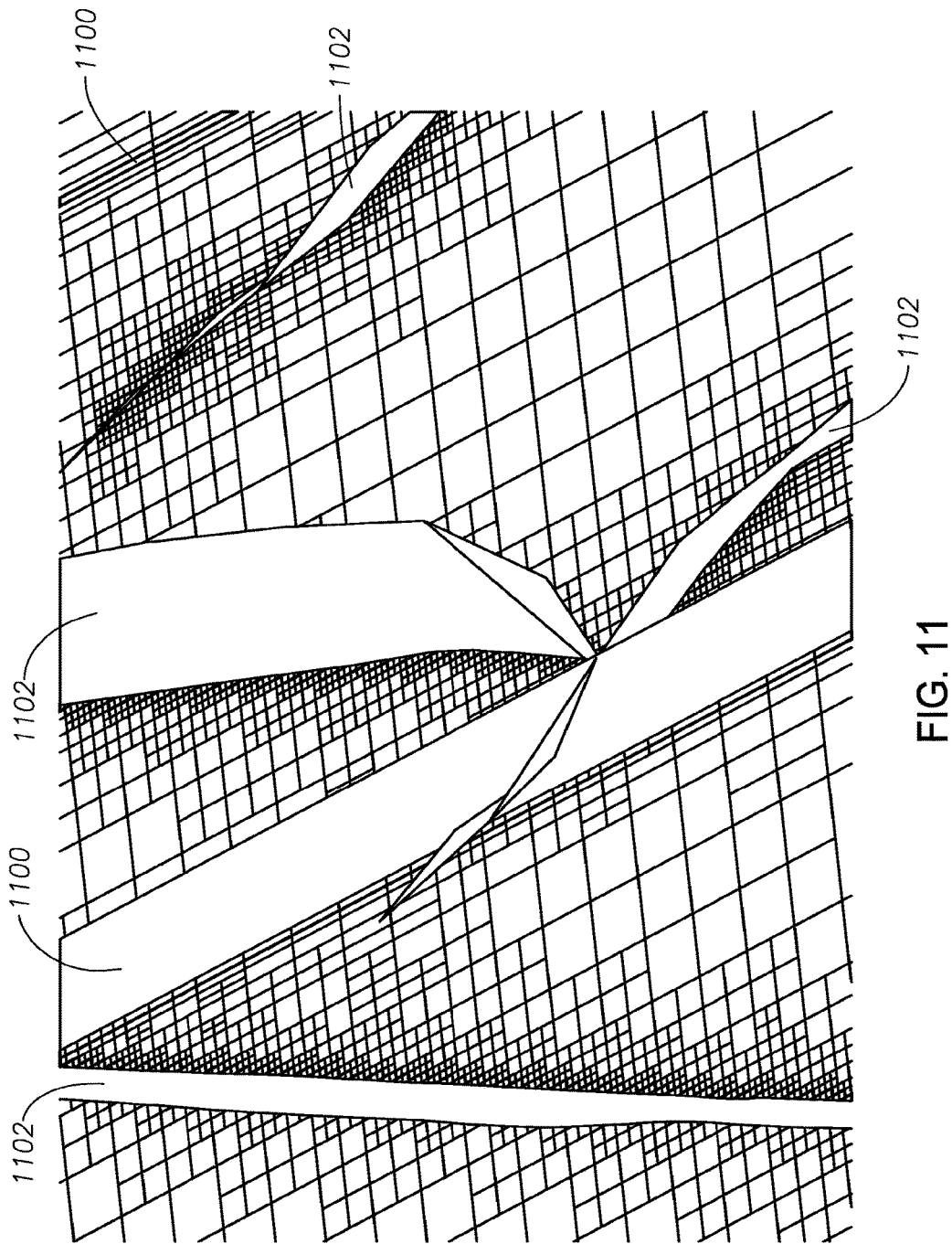

FIGS. 10 and 11 show a full model with both hydraulic and natural fractures meshed using the illustrative methods described herein. In FIG. 10, a slice through an example mesh generated with the refinement algorithm is shown, including hydraulic fracture 1000 and natural fractures 1002. In this example, the characteristic mesh size of the original mesh was 250 ft. The target sizes were ω=3.125 ft., α=250 ft. That is, for this mesh none of the levels used isotropic refinement, which resulted in $n_{ani}$=6. Note how the mesh resolution provided by the near-fracture cells is higher in the areas surrounding fractures 1000,1002 than those compared to the areas not surrounding fractures 1000,1002. In FIG. 11, FIG. 10 is shown with some of fractures 1100,1102 overlaid.

C. An Illustrative Method.

Figure 12A:
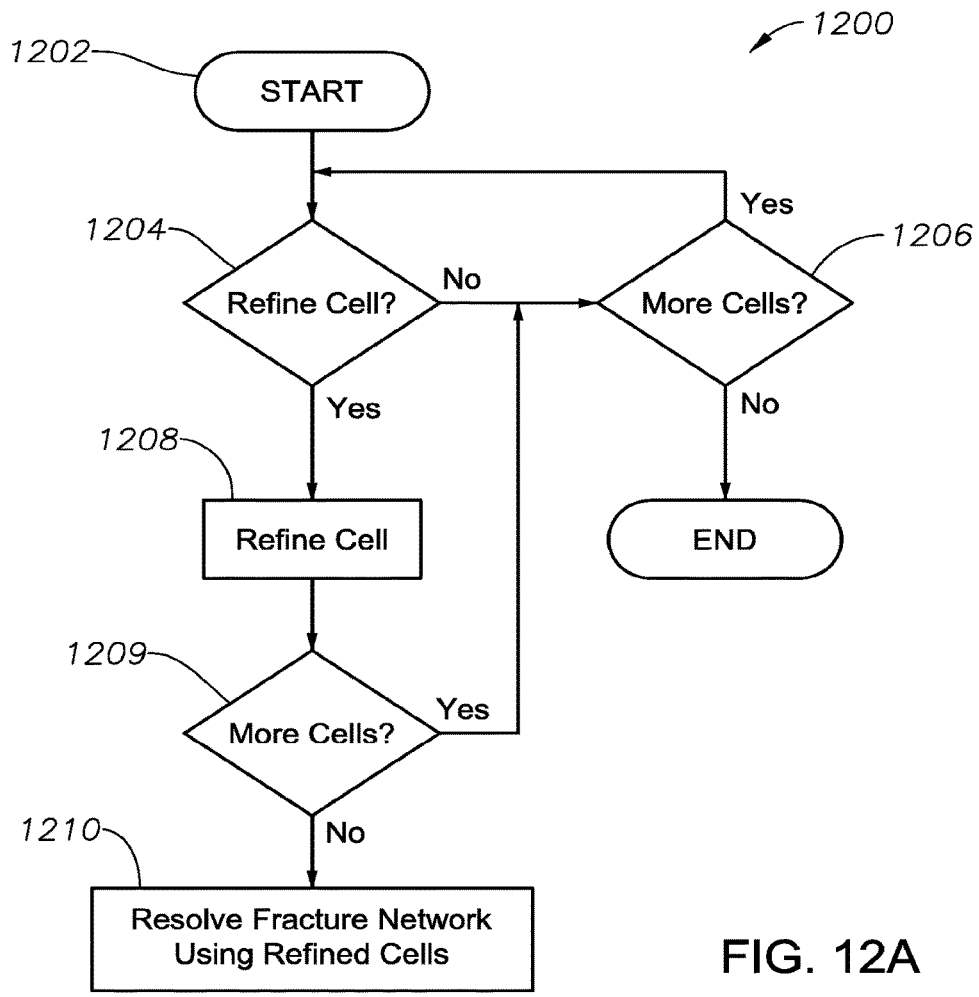
FIGS. 12A and 12B are flow charts illustrating an illustrative method of the present disclosure.

In view of the foregoing detailed description, one illustrative method of the present disclosure will now be described with reference to the flow chart of FIG. 12A. At block 1202, AGAR system 100 is initialized in order to generate a reservoir Earth Model. During initialization, AGAR engine 110 uploads data from fracture system module 112 and Earth Modeling module 114. Such data may include, for example, geocellular grid and fracture data. At block 1204, AGAR engine 110 analyzes all cells in the 3D Earth Model to determine whether cells in a mesh should be anisotropically refined (i.e., refined in any direction in the 3D space). If AGAR engine 110 determines the cell being analyzed does not require refinement, the algorithm moves onto to block 1206 where AGAR engine 110 then determines if there are other cells to be analyzed. If the determination is "NO" at block 1206, the algorithm will terminate. However, if the determination is "YES" at block 1206, the algorithm will loop back to block 1204 where the next cell will then be analyzed to determine if refinement is necessary.

If, at block 1204, AGAR engine 110 determines that the cell requires refinement, the algorithm moves onto block 1208 where that cell is refined. As previously described, gradation and intersection Rules are utilized to determine whether a cell should be refined. Once AGAR engine 110 refines the cells in the directions determined to be necessary, the algorithm moves onto block 1209 where AGAR engine 110 determines if there are other cells to be analyzed. If the determination is "YES," the algorithm moves onto to block 1206; if the determination if "NO," AGAR engine 110 then resolves the fracture network within the Earth Model using the refined cells at block 1210. The resulting model will possess a higher level of mesh resolution in those areas surrounding the fractures (i.e., near-fracture areas and the fractures), and lower mesh resolution in those non-near-fracture areas.

Figure 12C:
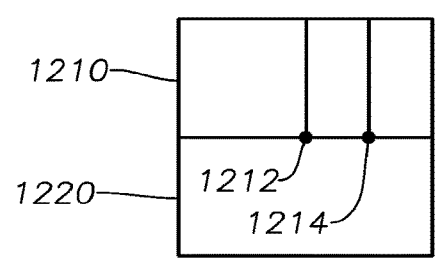
FIG. 12C is a two-dimensional illustration of hanging nodes.
Figure 12B:
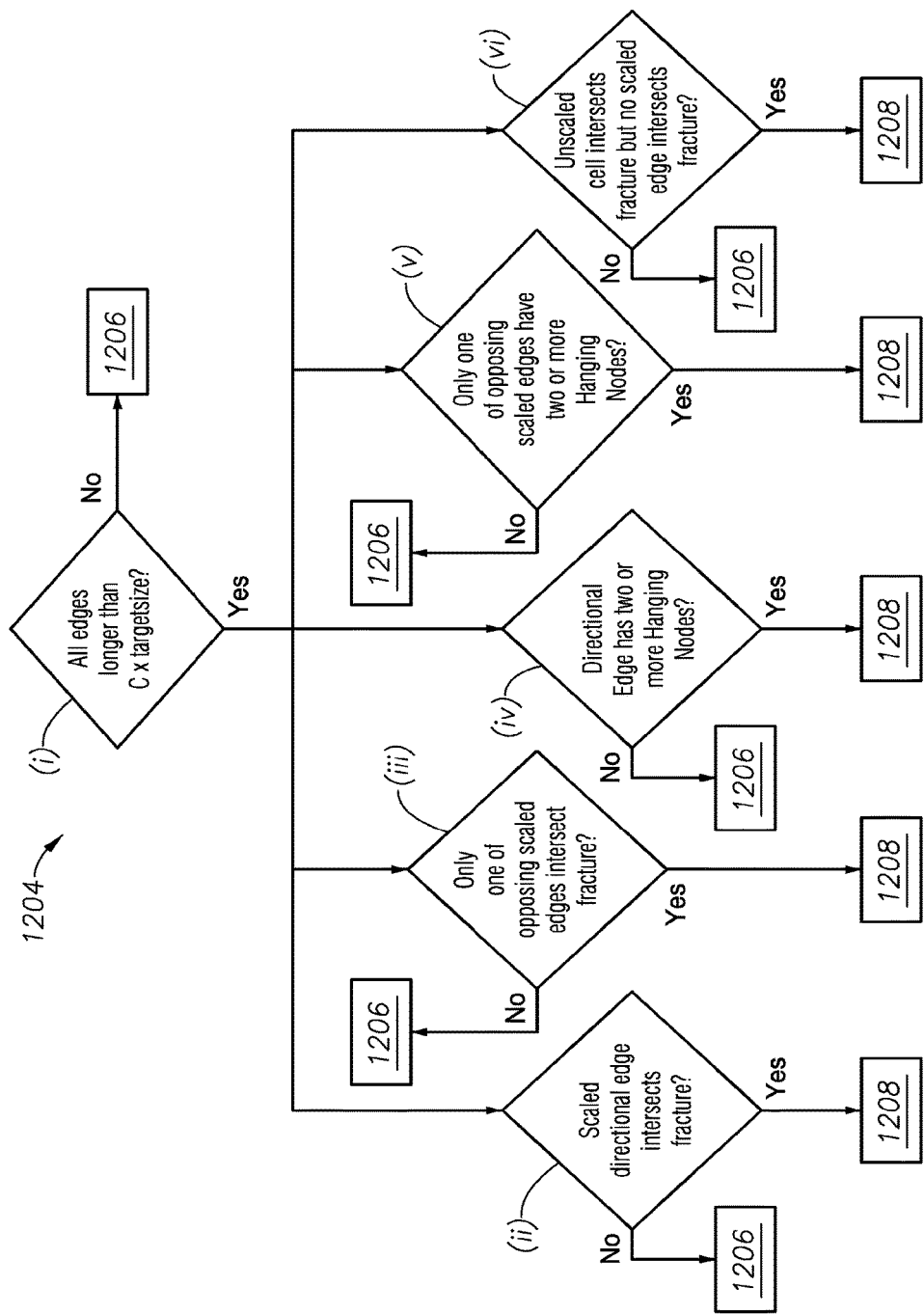

FIG. 12B is a flow chart of an illustrative refining method utilized in block 1204. To begin this analysis, note that the location of fractures within the fracture system is known based upon the data received from fracture system module 112. Using this data, along with the gradation and intersection Rules previously described, AGAR engine 110 locates those cells in the near-fracture regions of the model which require refinement. For those cells requiring refinement, all edges (and, thus, the cells) will be split in half in each refinement direction. The newly created cells will then be analyzed again in the next iteration, thereby ultimately increasing the mesh resolution. The resulting high resolution mesh provides more accurate numerical results in the near-fracture/fracture regions. The C×targetSize (where C=√2, e.g.) is determined as previously described above in Section A.

Nevertheless, at block 1204(i), AGAR engine determines whether all edges in the u-v-w directions for the cell (each direction is analyzed separately) are longer than C×targetSize. If all those edges are not, no refinement is required and the algorithm moves onto to block 1206. If, however, all those edges are longer than C×targetSize, the five Rules are then applied. Here, at blocks 1204(ii)-(vi), AGAR engine 110 determines if at least one of the following are met: ii) a scaled directional edge intersects a fracture; iii) for any opposing pair of edges in the 3D direction, exactly one of the two scaled edges intersect a fracture; iv) a directional edge has two or more "hanging" nodes; v) for any opposing pair of edges in the 3D direction, exactly one of the two edges has two or more hanging nodes; or vi) the unscaled cell intersect a fracture but no scaled edge of the cell intersects a fracture.

At block 1204(ii), with reference to FIG. 4, AGAR engine 110 determines if the scaled version of cell 400 (i.e., 400S) has an edge in the analyzed direction which intersects a fracture. At block 1204(iii), AGAR engine (for example) will analyze an opposing pair of edges in a given direction (e.g., edges 5 and 1 in FIG. 3), to determine if only one of the scaled edges intersects a fracture. At block 1204(iv), AGAR engine will determine if an edge in the analyzed direction has two or more hanging nodes. FIG. 12C is provided as an illustration of this principle. FIG. 12C show two adjacent cell faces 1210,1220 (shown in 2D for simplicity) having two nodes 1212,1214 positioned between them. Here, the first refinement would have split cell 1210 in half using node 1212. The second refinement would have split one of the new cells in half using node 1214. Therefore, nodes 1212,1214 are "hanging" with respect to cell 1220 because, although cell 1210 has been refined (in previous iteration), cell 1220 has not been refined. Since cell 1220 has at least two hanging nodes, AGAR engine 110 will also refine it in subsequent iterations.

At block 1204(v), AGAR engine 110 analyzes opposing edge pairs in the analyzed direction to determine whether only one of the edges has two or more hanging nodes. At block 1204(vi), AGAR engine 110 determines whether an unsealed cell intersects a fracture but no scaled edge of the cell intersects a fracture.

If the determination is "YES" to any of the five Rules described above, the algorithm will move on to block 1208 where that cell will be refined. If the determination is "NO" to all of the five Rules, the algorithm will move onto block 1206. This process will continue iteratively until each cell in the model has been analyzed. Once the analysis is complete, AGAR engine 110 will generate the Earth Model using the refined cells. The generated Earth Model may be utilized in a variety of applications, such as in a reservoir simulation. Thereafter, the reservoir simulation may be utilized to design and conduct a wellbore completion, and implement downhole operations accordingly.

Embodiments and methods described herein further relate to any one or more of the following paragraphs:

1. A computer-implemented method to generate a reservoir earth model, the method comprising (i)selecting cells in a mesh to be refined in a determined direction within a three-dimensional space; (ii)refining the selected cells in the determined direction; and (iii) resolving a fracture network within the earth model using the refined cells.

2. A computer-implemented method as defined in paragraph 1, further comprising utilizing the earth model in a reservoir simulation.

3. A computer-implemented method as defined in paragraphs 1 or 2, wherein refining the selected cells comprises splitting an edge of the selected cells, the edge being in the determined direction.

4. A computer-implemented method as defined in any of paragraphs 1-3, wherein the edge is split along a plane that is transverse to an axis of a fracture within the fracture network.

5. A computer-implemented method as defined in any of paragraphs 1-4, wherein (i) comprises determining a location of a fracture within the earth model; identifying cells in a near-fracture region; determining a target size of edges of the near-fracture cells; determining whether edges of the near-fracture cells in the determined direction are longer than the target size times a scalar variable; and identifying the near-fracture cells having edges in the determined direction which are longer than the target size is times the scalar variable.

6. A computer-implemented method as defined in any of paragraphs 1-5, wherein (i) further comprises scaling the edges of the identified near-fracture cells which are longer than the target size times the scalar variable; determining if the scaled edges intersect the fracture; and selecting the identified near-fracture cells having scaled edges that intersect the fracture.

7. A computer-implemented method as defined in any of paragraphs 1-5, wherein (i) further comprises scaling the edges of the identified near-fracture cells which are longer than the target size times the scalar variable; for any opposing pair of the scaled edges, determining whether exactly one of the two scaled edges intersect the fracture; and selecting the identified near-fracture cells having exactly one scaled edge intersecting the fracture.

8. A computer-implemented method as defined in any of paragraphs 1-5, wherein (i) further comprises determining whether the edges of the identified near-fracture cells which are longer than the target size times the scalar variable have two or more hanging nodes; and selecting the identified near-fracture cells having the two or more hanging nodes.

9. A computer-implemented method as defined in any of paragraphs 1-5, wherein (i) further comprises for any opposing pair of the edges of the identified near-fracture cells which are longer than the target size times the scalar variable, determining whether exactly one of the two edges has two or more hanging nodes; and selecting the identified near-fracture cells having the two or more hanging nodes.

10. A computer-implemented method as defined in any of paragraphs 1-5, wherein (i) further comprises scaling the edges of the identified near-fracture cells which are longer than the target size times the scalar variable; determining whether the identified near-fracture cells having scaled edges intersect a fracture while no unsealed near-fracture cells intersect a fracture; and selecting the identified near-fracture cells having scaled edges intersecting the fracture.

11. A computer-implemented method as defined in any of paragraphs 1-4, wherein (i) comprises determining a location of a fracture within the earth model; identifying cells in a near-fracture region; determining whether the near-fracture cells having an edge in the determined direction also have no more than one hanging node; and selecting the identified near-fracture cells having no more than one hanging node.

12. A computer-implemented method as defined in any of paragraphs 1-4, wherein (i) comprises determining a location of a fracture within the earth model; identifying cells in a near-fracture region; for any opposing pair of identified near-fracture cell edges, determining whether exactly one of the two opposing edges has two or more hanging nodes; and selecting the identified near-fracture cells having the two or more hanging nodes.

13. A computer-implemented method to generate a reservoir earth model, the method comprising (i) anisotropically refining cells in a mesh; and (ii) resolving a fracture network within the earth model using the refined cells.

14. A computer-implemented method as defined in paragraph 13, further comprising utilizing the earth model in a reservoir simulation.

15. A computer-implemented method as defined in paragraphs 13 or 14, wherein (i) comprises identifying a direction within a three-dimensional space in which the cells should be refined; and splitting an edge of the cells, the edge being in the determined direction.

16. A computer-implemented method as defined in any of paragraphs 13-15, wherein the edge is split along a plane that is perpendicular to an axis of a fracture within the fracture network.

17. A computer-implemented method as defined in any of paragraphs 13-16, wherein (i) comprises determining a location of a fracture within the earth model; identifying cells in a near-fracture region; determining a target size of edges of the near-fracture cells; determining whether edges of the near-fracture cells in the determined direction are longer than the target size times a scalar variable; and identifying the near-fracture cells having edges in the determined direction which are longer than the target size times the scalar variable.

18. A computer-implemented method as defined in any of paragraphs 13-17, wherein (i) further comprises scaling the edges of the identified near-fracture cells which are longer than the target size times the scalar variable; determining if the scaled edges intersect the fracture; and refining the identified near-fracture cells having scaled edges that intersect the fracture.

19. A computer-implemented method as defined in any of paragraphs 13-17, wherein (i) further comprises scaling the edges of the identified near-fracture cells which are longer than the target size times the scalar variable; for any opposing pair of the scaled edges, determining whether exactly one of the two scaled edges intersect the fracture; and refining the identified near-fracture cells having exactly one scaled edge intersecting the fracture.

20. A computer-implemented method as defined in any of paragraphs 13-17, wherein (i) further comprises determining whether the edges of the identified near-fracture cells which are longer than the target size times the scalar variable have two or more hanging nodes; and refining the identified near-fracture cells having the two or more hanging nodes.

21. A computer-implemented method as defined in any of paragraphs 13-17, wherein (i) further comprises for any opposing pair of the edges of the identified near-fracture cells which are longer than the target size times the scalar variable, determining whether exactly one of the two edges has two or more hanging nodes; and refining the identified near-fracture cells having the two or more hanging nodes.

22. A computer-implemented method as defined in any of paragraphs 13-17, wherein (i) further comprises scaling the edges of the identified near-fracture cells which are longer than a the target size times the scalar variable; determining whether the identified near-fracture cells having scaled edges intersect a fracture while no unscaled identified near-fracture cells intersect a fracture; and refining the identified near-fracture cells having scaled edges intersecting the fracture.

23. A computer-implemented method as defined in any of paragraphs 13-16, wherein (i) comprises determining a location of a fracture within the earth model; identifying cells in a near-fracture region; identifying a direction within a three-dimensional dimensional space in which the identified near-fracture cells should be refined; determining whether the identified near-fracture cells having an edge in the identified direction also have no more than one hanging node; and refining the identified near-fracture cells having no more than one hanging node.

24. A computer-implemented method as defined in any of paragraphs 13-16, wherein (i) comprises determining a location of a fracture within the earth model; identifying cells in a near-fracture region; for any opposing pair of identified near-fracture cell edges, determining whether exactly one of the two opposing edges has two or more hanging nodes; and refining the identified near-fracture cells having the two or more hanging nodes.

Furthermore, any of the illustrative methods described herein may be implemented by a system comprising processing circuitry or a computer program product comprising instructions which, when executed by at least one processor, causes the processor to perform any of the methods described herein.

Although various embodiments and methods have been shown and described, the disclosure is not limited to such embodiments and methods and will be understood to include all modifications and variations as would be apparent to one skilled in the art. Therefore, it should be understood that the disclosure is not intended to be limited to the particular forms disclosed. Rather, the intention is to cover all modifications, equivalents and alternatives falling within the spirit and scope of the disclosure as defined by the appended claims.

What is claimed is:

1. A computer-implemented method of refining an earth model of a reservoir formation for well planning and placement, the method comprising:
   selecting, by a computer system, cells in a mesh to be refined in a determined direction within a three-dimensional space representing the reservoir formation, the selecting by:
      determining a location of a fracture within the earth model;
      identifying cells in a near-fracture region, based on the location of the fracture;
      determining a target size of edges of the identified near-fracture cells;
      determining whether edges of the near-fracture cells in the determined direction are longer than the target size times a scalar variable; and
      identifying the near-fracture cells having edges in the determined direction which are determined to be longer than the target size times the scalar variable;
   refining the selected cells in the determined direction;
   resolving a fracture network within the earth model using the refined cells;
   utilizing the earth model in a reservoir simulation, based on the resolved fracture network; and
   drilling a wellbore within the reservoir formation based on the reservoir simulation.

2. A computer-implemented method as defined in claim 1, wherein refining the selected cells comprises splitting an edge of the selected cells, the edge being in the determined direction.

3. A computer-implemented method as defined in claim 2, wherein the edge is split along a plane that is transverse to an axis of a fracture within the fracture network.

4. A computer-implemented method as defined in claim 1, wherein the selecting further comprises:
   scaling the edges of the identified near-fracture cells which are longer than the target size times the scalar variable;
   determining if the scaled edges intersect the fracture; and
   selecting the identified near-fracture cells having scaled edges that intersect the fracture.

5. A computer-implemented method as defined in claim 1, wherein the selecting further comprises:
   scaling the edges of the identified near-fracture cells which are longer than the target size times the scalar variable;
   for any opposing pair of the scaled edges, determining whether exactly one of the two scaled edges intersect the fracture; and
   selecting the identified near-fracture cells having exactly one scaled edge intersecting the fracture.

6. A computer-implemented method as defined in claim 1, wherein the selecting further comprises:
   determining whether the edges of the identified near-fracture cells which are longer than the target size times the scalar variable have two or more hanging nodes; and
   selecting the identified near-fracture cells having the two or more hanging nodes.

7. A computer-implemented method as defined in claim 1, wherein the selecting further comprises:
   for any opposing pair of the edges of the identified near-fracture cells which are longer than the target size times the scalar variable, determining whether exactly one of the two edges has two or more hanging nodes; and
   selecting the identified near-fracture cells having the two or more hanging nodes.

8. A computer-implemented method as defined in claim 1, wherein the selecting further comprises:
   scaling the edges of the identified near-fracture cells which are longer than the target size times the scalar variable;
   determining whether the identified near-fracture cells having scaled edges intersect a fracture while no unscaled near-fracture cells intersect a fracture; and
   selecting the identified near-fracture cells having scaled edges intersecting the fracture.

9. A computer-implemented method as defined in claim 1, wherein the selecting comprises:
   determining whether the near-fracture cells having an edge in the determined direction also have no more than one hanging node; and
   selecting the identified near-fracture cells having no more than one hanging node.

10. A computer-implemented method as defined in claim 1, wherein the selecting comprises:
    for any opposing pair of identified near-fracture cell edges, determining whether exactly one of the two opposing edges has two or more hanging nodes; and
    selecting the identified near-fracture cells having the two or more hanging nodes.

11. A computer-implemented method of refining an earth model of a reservoir formation for well planning and placement, the method comprising:
    anisotropically, by a computer system, refining cells of a mesh in a determined direction within a three-dimensional space representing the reservoir formation by:
       determining a location of a fracture within the earth model;
       identifying cells in a near-fracture region, based on the location of the fracture;
       determining a target size of edges of the identified near-fracture cells;
       determining whether edges of the near-fracture cells in the determined direction are longer than the target size times a scalar variable; and
       identifying the near-fracture cells having edges in the determined direction which are determined to be longer than the target size times the scalar variable;
    resolving a fracture network within the earth model using the refined cells;
    utilizing the earth model in a reservoir simulation, based on the resolved fracture network; and
    drilling a wellbore within the reservoir formation based on the reservoir simulation.

12. A computer-implemented method as defined in claim 11, wherein the anisotropically refining further comprises:
    splitting an edge of the cells, the edge being in the determined direction.

13. A computer-implemented method as defined in claim 12, wherein the edge is split along a plane that is perpendicular to an axis of a fracture within the fracture network.

14. A computer-implemented method as defined in claim 11, wherein the anisotropically refining further comprises:
    determining whether the identified near-fracture cells having an edge in the identified direction also have no more than one hanging node; and
    refining the identified near-fracture cells having no more than one hanging node.

15. A computer-implemented method as defined in claim 11, wherein the anisotropically refining further comprises:
    scaling the edges of the identified near-fracture cells which are longer than the target size times the scalar variable;
    determining if the scaled edges intersect the fracture; and
    refining the identified near-fracture cells having scaled edges that intersect the fracture.

16. A computer-implemented method as defined in claim 11, wherein the anisotropically refining further comprises:
    scaling the edges of the identified near-fracture cells which are longer than the target size times the scalar variable;
    for any opposing pair of the scaled edges, determining whether exactly one of the two scaled edges intersect the fracture; and
    refining the identified near-fracture cells having exactly one scaled edge intersecting the fracture.

17. A computer-implemented method as defined in claim 11, wherein the anisotropically refining further comprises:
    determining whether the edges of the identified near-fracture cells which are longer than the target size times the scalar variable have two or more hanging nodes; and
    refining the identified near-fracture cells having the two or more hanging nodes.

18. A computer-implemented method as defined in claim 11, wherein the anisotropically refining further comprises:

for any opposing pair of the edges of the identified near-fracture cells which are longer than the target size times the scalar variable, determining whether exactly one of the two edges has two or more hanging nodes; and refining the identified near-fracture cells having the two or more hanging nodes.

19. A computer-implemented method as defined in claim 12, wherein the anisotropically refining further comprises:

scaling the edges of the identified near-fracture cells which are longer than a the target size times the scalar variable;

determining whether the identified near-fracture cells having scaled edges intersect a fracture while no unscaled identified near-fracture cells intersect a fracture; and refining the identified near-fracture cells having scaled edges intersecting the fracture.

20. A computer-implemented method as defined in claim 11, wherein the anisotropically refining further comprises:

for any opposing pair of identified near-fracture cell edges, determining whether exactly one of the two opposing edges has two or more hanging nodes; and refining the identified near-fracture cells having the two or more hanging nodes.

21. A computer-readable storage medium comprising instructions which, when executed by at least one processor, cause the at least one processor to perform a plurality of functions, including functions to:

select cells in a mesh of an earth model to be refined in a determined direction within a three-dimensional space representing a reservoir formation by:

determining a location of a fracture within the earth model;

identifying cells in a near-fracture region, based on the location of the fracture;

determining a target size of edges of the identified near-fracture cells;

determining whether edges of the near-fracture cells in the determined direction are longer than the target size times a scalar variable; and identifying the near-fracture cells having edges in the determined direction which are determined to be longer than the target size times the scalar variable;

refine the selected cells in the determined direction;

resolve a fracture network within the earth model using the refined cells; and utilize the earth model in a reservoir simulation, based on the resolved fracture network, wherein a wellbore is drilled within the reservoir formation based on the reservoir simulation.

22. A system comprising:

a processor; and a memory coupled to the processor, the memory having instructions stored therein, which when executed by the processor, cause the processor to perform a plurality of functions, including functions to:

select cells in a mesh of an earth model to be refined in a determined direction within a three-dimensional space representing a reservoir formation by:

determining a location of a fracture within the earth model;

identifying cells in a near-fracture region, based on the location of the fracture;

determining a target size of edges of the identified near-fracture cells;

determining whether edges of the near-fracture cells in the determined direction are longer than the target size times a scalar variable; and identifying the near-fracture cells having edges in the determined direction which are determined to be longer than the target size times the scalar variable;

refine the selected cells in the determined direction;

resolve a fracture network within the earth model using the refined cells; and utilize the earth model in a reservoir simulation, based on the resolved fracture network, wherein a wellbore is drilled within the reservoir formation based on the reservoir simulation.

* * * * *

UNITED STATES PATENT AND TRADEMARK OFFICE
CERTIFICATE OF CORRECTION

PATENT NO.         : 10,310,139 B2
APPLICATION NO.    : 15/313933
DATED              : June 4, 2019
INVENTOR(S)        : Michael L. Brewer et al.

Page 1 of 1

It is certified that error appears in the above-identified patent and that said Letters Patent is hereby corrected as shown below:

In the Specification

In Column 2, Line 16: "arc" should be --are--;
In Column 3, Line 40: delete "is";
In Column 5, Line 1: "arc" should be --are--;
In Column 5, Line 22: "unsealed" should be --unscaled--;
In Column 11, Line 46: "unsealed" should be --unscaled--;
In Column 12, Line 20: delete "is";
In Column 12, Line 55: "unsealed" should be --unscaled--;
In Column 14, Line 8: delete duplicate "dimensional".

Signed and Sealed this
Twenty-second Day of October, 2019

Andrei Iancu
*Director of the United States Patent and Trademark Office*